United States Patent
Park et al.

(10) Patent No.: US 9,130,082 B2
(45) Date of Patent: Sep. 8, 2015

(54) APPARATUS FOR GENERATING/DETECTING TERAHERTZ WAVE USING GRAPHENE AND MANUFACTURING METHOD OF THE SAME

(71) Applicant: ELECTRONICS AND TELECOMMUNICATIONS RESEARCH INSTITUTE, Daejeon (KR)

(72) Inventors: Kyung Hyun Park, Daejeon (KR); Sang-Pil Han, Daejeon (KR); Jeong Woo Park, Daejeon (KR); Han-Cheol Ryu, Daejeon (KR); Kiwon Moon, Pohang (KR); Namje Kim, Daejeon (KR); Hyunsung Ko, Seoul (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 14 days.

(21) Appl. No.: 14/063,361

(22) Filed: Oct. 25, 2013

(65) Prior Publication Data
US 2014/0183441 A1    Jul. 3, 2014

(30) Foreign Application Priority Data
Dec. 27, 2012  (KR) .......................... 10-2012-0154839

(51) Int. Cl.
*H01Q 13/08*    (2006.01)
*H01L 31/028*   (2006.01)
*H01L 31/08*    (2006.01)

(52) U.S. Cl.
CPC ............ *H01L 31/028* (2013.01); *H01L 31/085* (2013.01)

(58) Field of Classification Search
CPC .................................................. H01Q 13/085
See application file for complete search history.

(56) References Cited

U.S. PATENT DOCUMENTS

2006/0081889 A1* 4/2006 Shur et al. ....................... 257/221
2013/0015375 A1* 1/2013 Avouris et al. ............ 250/504 R

FOREIGN PATENT DOCUMENTS

KR    10-2012-0042655 A    5/2012
KR    10-2012-0092431 A    8/2012

OTHER PUBLICATIONS

K. S. Novoselov et al., "Electric Field Effect in Atomically Thin Carbon Films", Science, Oct. 22, 2004, pp. 666-669, vol. 306, No. 5696, <doi: 10.1126/science.1102896>.

\* cited by examiner

*Primary Examiner* — Constantine Hannaher (57) ABSTRACT

Provided is a terahertz wave generating/detecting apparatus and a method for manufacturing the same. The terahertz wave generating/detecting apparatus includes; a substrate having an active region and a transmitting region; a lower metal layer extending in a first direction on the active region and the transmitting region of the substrate; a graphene layer disposed on the lower metal layer on the active region; and upper metal layers extending in the first direction on the graphene layer of the active region and the substrate in the transmission region, wherein a terahertz wave is generated or amplified by a surface plasmon polariton that is induced on a boundary surface between the graphene layer and the lower metal layer by beated laser light applied to the graphene layer and the metal layer.

17 Claims, 7 Drawing Sheets

APPARATUS FOR GENERATING/DETECTING TERAHERTZ WAVE USING GRAPHENE AND MANUFACTURING METHOD OF THE SAME

CROSS-REFERENCE TO RELATED APPLICATIONS

This U.S. non-provisional patent application claims priority under 35 U.S.C. §119 of Korean Patent Application No. 10-2012-0154839, filed on Dec. 27, 2012, the entire contents of which are hereby incorporated by reference.

BACKGROUND OF THE INVENTION

The present invention disclosed herein relates to an optical device and a method for manufacturing the same, and more particularly, to an apparatus for generating/detecting a terahertz wave using graphene.

A frequency region of about 0.1 THz to about 10 THz (where 1 THz=$10^{12}$ Hz) is defined as a terahertz wave in electromagnetic wave spectrum band. Particularly, a frequency region of about 0.1 THz to about 3 THz is a region in which rotational resonant frequencies of various molecules exist. Since the terahertz is used for a non-destructive method, a non-opening method, and a non-contact method, it will provide a future promising technology having a new conception which does not exist so far in medicines, medical sciences, agriculture foods, environment measurements, bio, communication, nondestructive inspection, advanced material evaluation, and the like. Recently, terahertz-related technologies are being actively developed.

The terahertz technologies are recognized as core technologies for realizing the human-centered ubiquitous society because a band electromagnetic wave has low energy of about several meV which has a little influence on human bodies. Therefore, it may be expected that the terahertz technologies significantly increase in demand. Although numerous related-studies are introduced, terahertz technologies which satisfy real-time, portable, low cost, and broadband properties at the same time are not developed yet. Since terahertz technologies are continuously improved to announce noticeable results with respect to terahertz spectrum and video image application, it may be expected that envisioned suggestions for systems are proposed soon. Unlike a terahertz image system in which it is necessary to utilize a high-output wave source and a high sensitivity array type detector, a terahertz wave source having a broadband is essential in the terahertz spectrum. Since broadband characteristics of several terahertz-classes are relatively easily realized under the optical base, the terahertz technologies are developed so for as optical technology bases.

SUMMARY OF THE INVENTION

The present invention provides a novel apparatus for generating/detecting a terahertz wave using graphene.

The present invention also provides an apparatus for generating/detecting a terahertz wave which is capable of using a catalyst layer for forming graphene as a medium for generating/detecting the terahertz wave.

Embodiments of the present invention provide terahertz wave generating/detecting apparatuses including: a substrate having an active region and a transmitting region; a lower metal layer extending in a first direction on the active region and the transmitting region of the substrate; a graphene layer disposed on the lower metal layer of the active region; and upper metal layers extending in the first direction on the graphene layer of the active region and the substrate of the transmission region, wherein a terahertz wave is generated or amplified by a surface plasmon polariton that is induced on a boundary surface between the graphene layer and the lower metal layer by beated laser light applied to the graphene layer and the lower metal layer.

In some embodiments, the upper metal layers may be spaced apart from each other in a second direction crossing the first direction. A dielectric layer may further be included on the graphene layer between the upper metal layers.

In other embodiments, the dielectric layer may include a polymer. The polymer may include benzocyclobutene (BCB). The polymer may include a certain material having an adequate refractive index required forming the surface plasmon polariton.

In still other embodiments, the terahertz wave generating/detecting apparatuses may further include an interlayer dielectric between the lower metal layer and upper metal layers on the transmitting region. The interlayer dielectric may surround the lower metal layer on the active region of the substrate and, may have the same level as the graphene layer.

In even other embodiments, the graphene layer may have a width line greater than that of the lower metal layer.

In yet other embodiments, the lower metal layer may include nickel (Ni), copper (Cu), or platinum (Pt).

In further embodiments, the terahertz wave generating/detecting apparatuses may further include a transmitting antenna connected to the lower metal layer and the upper metal layers on the transmitting region. The substrate may have a reception region which is defined in the other side of the active region facing the transmitting region. The lower metal layer and the upper metal layers may extend to the reception region. The terahertz wave generating/detecting apparatuses may further include a receiving antenna connected to the lower metal layer and upper metal layers on the reception region.

In still further embodiments, the terahertz wave generating/detecting apparatuses may further include a bias input terminal to which a bias voltage is applied to generate or amplify the terahertz wave, the bias input terminal being disposed between the lower metal layer and the upper metal layers, and the bias input terminal in which a bias voltage is applied for generating or amplifying the terahertz wave.

In other embodiments of the present invention, methods for manufacturing a terahertz wave generating/detecting apparatus include forming a lower metal layer in an active region and a transmitting region of a substrate in; forming a graphene layer in the lower metal layer in the active region; forming the graphene layer and the lower metal layer with a predetermined line width in a first direction;

forming an interlayer dielectric around the graphene layer in the active region and on the lower metal layer in the transmitting region; and forming a plurality of upper metal layers extending in the first direction on the graphene layer and the interlayer dielectric in the transmitting region, wherein the plurality of upper layers are spaced apart from each other in a second direction crossing the first direction.

In some embodiments, the methods may further include etching the lower metal layer with a line width less than that of the graphene layer. The etching of the lower metal layer may include a wet etching method. The wet etching method of the lower metal layer may be performed by using hydrofluoric acid, nitric acid, or hydrochloric acid.

In other embodiments, the methods may further include forming a dielectric layer between the upper metal layers on the graphene layer. The dielectric layer may include a polymer formed by using an inkjet printing method or a screen process method.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Hereinafter, preferred embodiments of the present invention will be described in detail with reference to the accompanying drawings in such a manner that the technical idea of the present invention may easily be carried out by a person with ordinary skill in the art to which the invention pertains. The present disclosure may, however, be embodied in different forms and should not be construed as limited to the embodiments set forth herein.

In the drawings, anything unnecessary for describing the present disclosure will be omitted for clarity, and also like reference numerals in the drawings denote like elements.

In the specification and in the whole claims, when it is described that one comprises (or includes or has) some elements, it should be understood that it may comprise (or include or has) only those elements, or it may comprise (or include or have) other elements as well as those elements if there is no specific limitation.

It will be understood that when a layer, a film, a region, or a plate is referred to as being 'on' another layer, film, region, or plate, it can be directly on the other layer, region, or plate, or intervening layers, films, regions, or plates may also be present. On the other hand, it will also be understood that when a layer, a film, an area or a plate is referred to as being "directly on" another one, intervening layers, films, areas, and plates may not be present.

Figure 1:
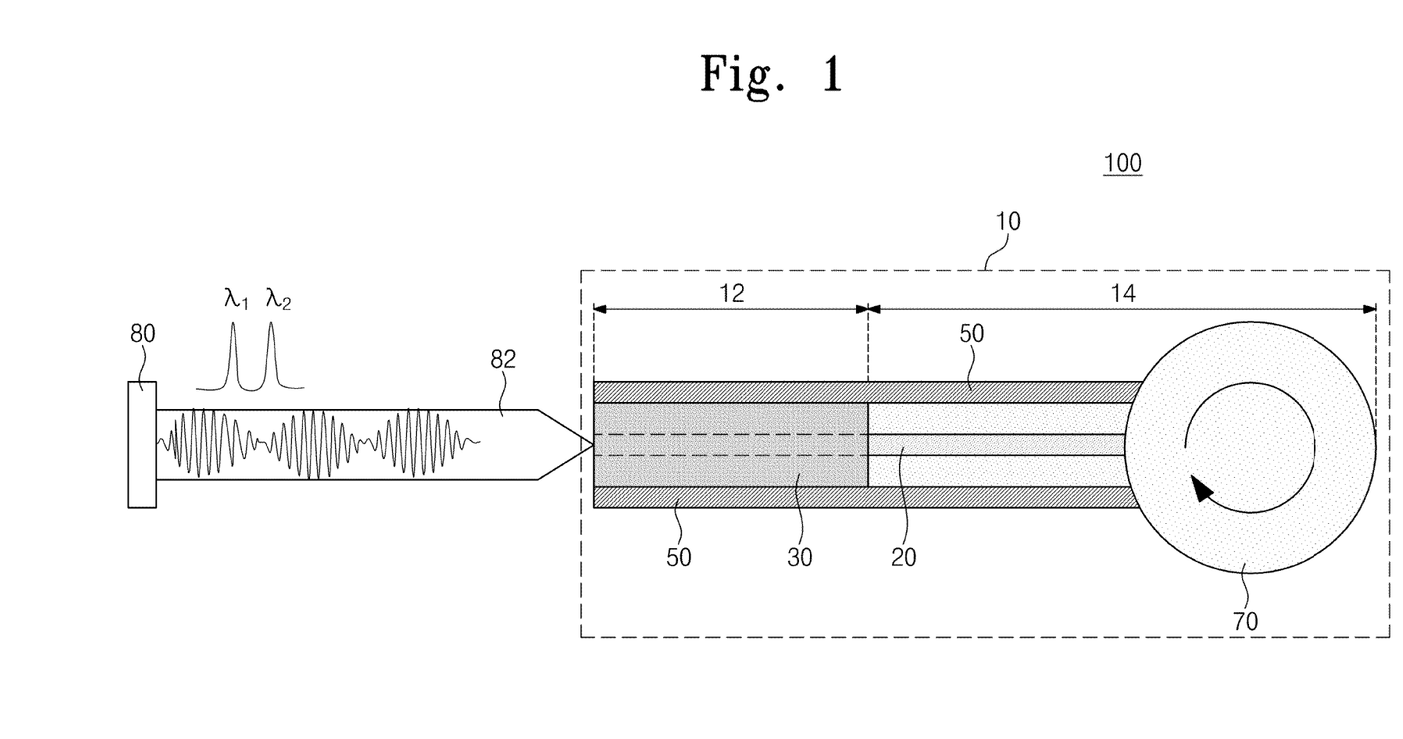
FIG. 1 is a plan view of a terahertz wave generating/detecting apparatus according to an embodiment of the inventive concept.
Figure 2:
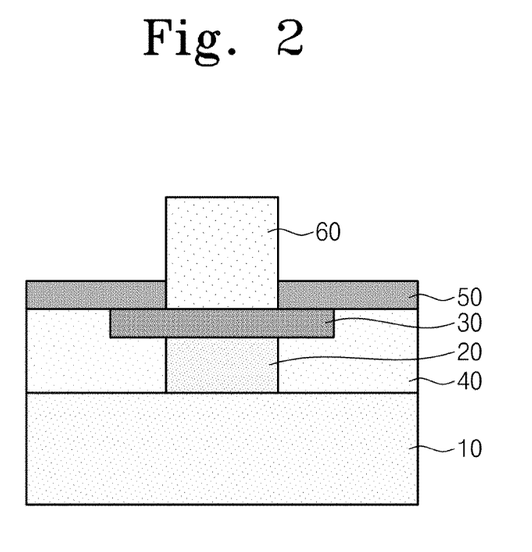
FIG. 2 is a cross-sectional view of an active region of FIG. 1.

FIG. 1 is a plan view of a terahertz wave generating/detecting apparatus 100 according to an embodiment of the inventive concept. FIG. 2 is a sectional view of an active region of FIG. 1.

Referring to FIGS. 1 and 2, the terahertz wave generating/detecting apparatus 100 according to an embodiment of the inventive concept may include a substrate 10, a lower metal layer 20, a graphene layer 30, an interlayer dielectric 40, upper metal layers 50, a dielectric layer 60, and a transmitting antenna 70.

The substrate 10 may have an active region 12, and a transmitting region 14. The lower metal layer 20, the graphene layer 30, the interlayer dielectric 40, and the upper metal layers 50 may be disposed on the substrate 10 in the active region 12. The substrate 10 may have crystalline silicon. The crystalline silicon may be doped with impurities to have high resistance. However, the present invention is not limited thereto. For example, the substrate 10 may be formed of various materials.

The lower metal layer 20 may extend from the active region 12 to the transmitting region 14 on the substrate in a first direction. The lower metal layer 20 may be formed of nickel (Ni), copper (Cu), or platinum (Pt).

The graphene layer 30 may be disposed on the lower metal layer 20 of the active region 12 in the first direction. The lower metal layer 20 may have a line width less than that of the graphene layer 30. Each of the graphene layer 30 and the lower metal layer 20 may have a mushroom shape in section. The active region 12 of the substrate 10 may be substantially defined by the graphene layer 30.

The interlayer dielectric 40 may be disposed between the lower metal layer 20 and the upper metal layers 50. The interlayer dielectric 40 covers the lower metal layer 20 in the transmitting region 14. The graphene layer 30 and the interlayer dielectric 40 may have the same level in the active region 12. The upper metal layers 50 may be disposed on the graphene layer 30 and the interlayer dielectric 40. The interlayer insulation layer 40 may include a silicon oxide layer or a silicon nitride layer.

The upper metal layers 50 may extend in the first direction. The upper metal layers 50 may be spaced apart from each other in a second direction on the graphene layer 30 and the interlayer dielectric 40. Each of the upper metal layers 50 may be formed of a metal such as titanium (Ti), platinum (Pt), copper (Cu), or aluminum (Al).

The dielectric layer 60 may be disposed between the upper metal layers 50. The dielectric layer 60 may be formed of a polymer such as benzocyclobutene (BCB). The benzocyclobutene (BCB) may have a low refractive index. The upper metal layers 50 and the lower metal layer 20 may be connected to the transmitting antenna 70 on a reception region 16 of the substrate 10.

A beating light source 80 may respectively emit laser light 82 onto each of side surfaces of the graphene layer 30, the lower metal layer 20, and the upper metal layers 50 in the active region 12. The laser light 82 may have a plurality of wavelength bands having a small wavelength difference therebetween. The laser light 82 may be beat. Here, it may be defined as the laser light 82 having a first wavelength $\lambda 1$ and a second wavelength $\lambda 2$ is beat. The beated laser light 82 is coupled to a first boundary surface between the lower metal layer 20 and the graphene layer 30 or a second boundary surface between the graphene layer 30 and the upper metal layers 50 to generate a surface plasmon polariton that is a progressive wave of a high-density electron. The surface plasmon polariton may be generated by an interaction between free electrons of the metal surface and the laser light 82. The graphene layer 30 may function as an N-type or P-type semiconductor by beating of the laser light 82. The graphene layer 30 may be activated by the surface plasmon polariton to generate a terahertz wave. Also, the lower metal layer 20 may be used as a medium for generating and transmitting the terahertz wave. The terahertz wave may be transmitted up to the transmitting antenna 70 along the lower metal layer 20 and the upper metal layers 50. The transmitting antenna 70 may transmit the terahertz wave to the outside. Although not shown, the transmitting antenna 70 or a bias input terminal (not shown) may be disposed between the upper metal layers 50 and the lower metal layer 20. A band gap of the graphene layer 30 may be controlled or the terahertz wave may be amplified by a power voltage which is inputted into the bias input terminal A method for manufacturing the terahertz wave generating/detecting apparatus 100 according to an embodiment of the inventive concept will be described below.

FIGS. 3 to 10 are cross-sectional views illustrating a method of manufacturing terahertz wave generating/detecting apparatus 100 on the basis on FIG. 2 according to an embodiment of the inventive concept.

Figure 3:
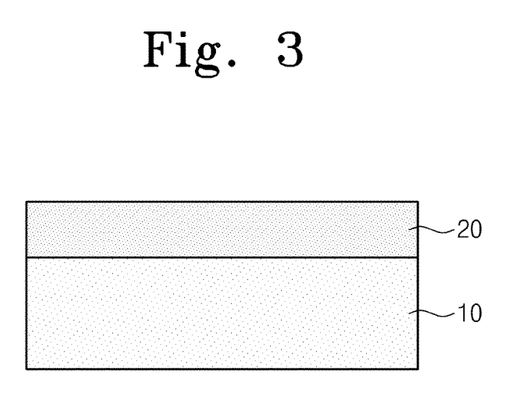
FIGS. 3 to 10 are cross-sectional views of a method for manufacturing a terahertz wave generating/detecting apparatus on the basis of FIG. 2 according to an embodiment of the inventive concept.

Referring to FIG. 3, a lower metal layer 20 is formed on a substrate 10. The lower metal layer 20 may be formed of a metal such as nickel (Ni), copper (Cu), or platinum (Pt). The metal may be formed by a sputtering method, a thermal deposition process method, or a chemical vapor deposition method.

Figure 4:
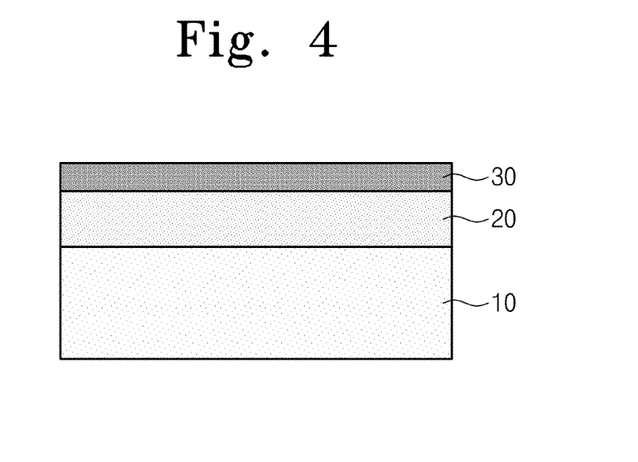

Referring to FIG. 4, a graphene layer 30 is formed on the lower metal layer 20. The graphene layer 30 may be formed by the chemical vapor deposition method. The lower metal layer 20 may be used as a growth catalyst layer of the graphene layer 30.

Figure 5:
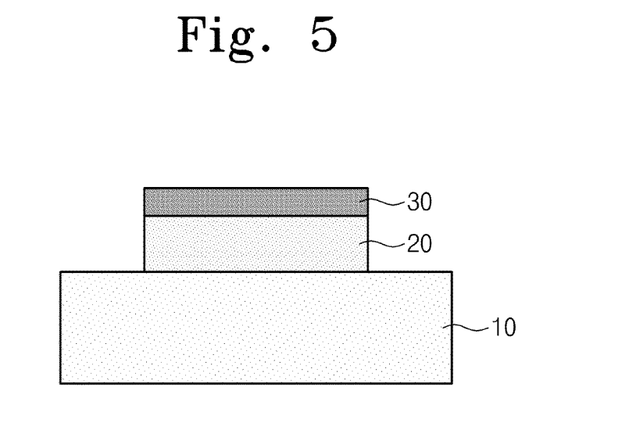

Referring to FIG. 5, the graphene layer 30 and the lower metal layer 20 are patterned. Each of the graphene layer 30 and the lower metal layer 20 may be patterned by an electron beam lithography method or a photolithography method.

Figure 6:
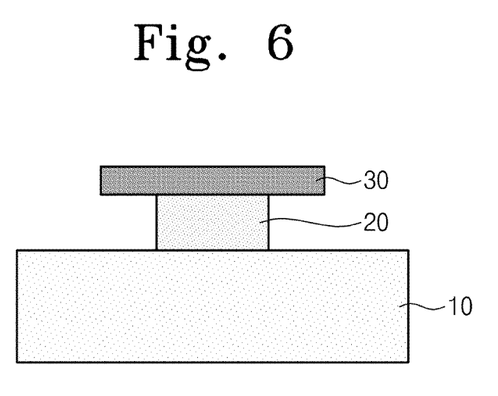

Referring to FIG. 6, the lower metal layer 20 is reduced in line width. The lower metal layer 20 may be etched by a dry etching method and a wet etching method. The lower metal layer 20 may be etched by used by using a well-known etching solution for the metal layer or an active gas such as chlorine. The graphene layer 30 may have a line width larger than that of the lower metal layer 20. The lower metal layer 20 may remain between the substrate 10 and the graphene layer 30. Thus, the lower metal layer 20 used as the catalyst layer of the graphene layer 30 may be used as a medium for generating and transmitting the terahertz wave.

Figure 7:
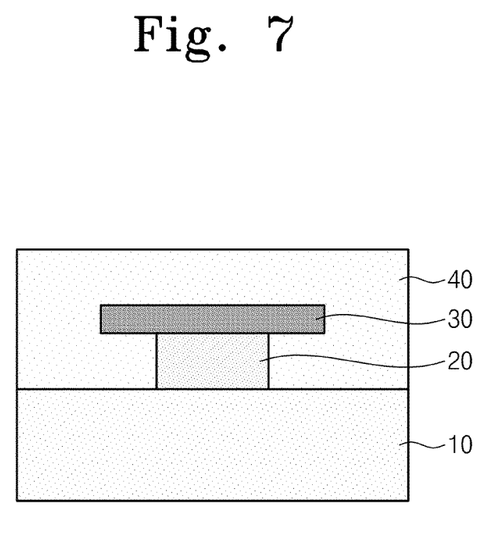

Referring to FIG. 7, an interlayer insulation layer 40 is formed on an entire surface of the first substrate 10. The interlayer dielectric 40 may include a silicon oxide layer or a silicon nitride layer that is formed by a chemical vapor deposition method or a sol-gel method.

Figure 8:
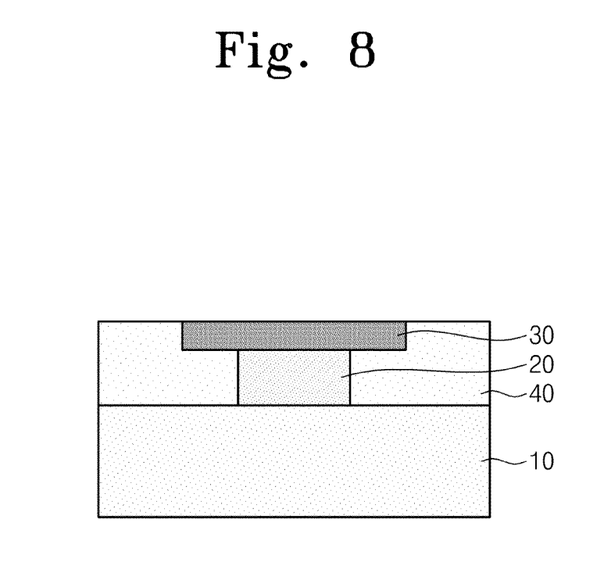

Referring to FIG. 8, the interlayer dielectric 40 is removed to be planarized. The interlayer dielectric 40 may be planarized by a dry etching method or a chemical mechanical polishing (CMP) method. The interlayer dielectric 40 may be removed until the graphene layer 30 is exposed.

Figure 9:
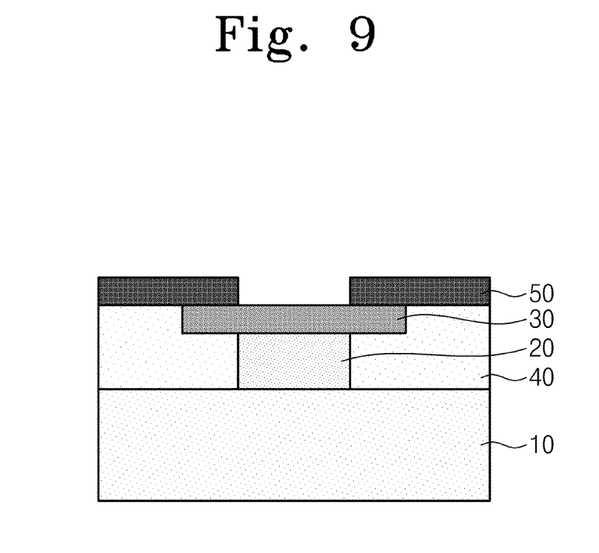

Referring to FIG. 9, upper metal layers 50 are formed on the graphene layer 30. The upper metal layers 50 may be formed by a depositing process and a photolithography process. A deposition process may include a sputtering method, a thermal deposition method, or a chemical vapor deposition method.

Figure 10:
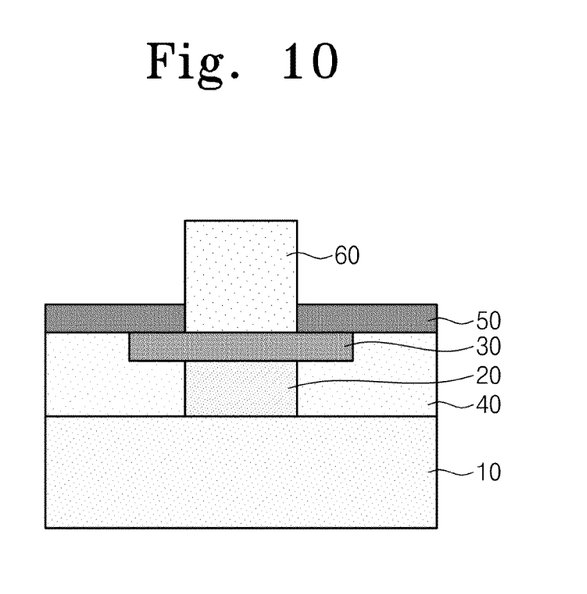

Referring to FIG. 10, a dielectric layer 60 is formed between the upper metal layers 50. The dielectric layer 60 may be formed by using an inkjet printing method or a screen process method.

Figure 11:
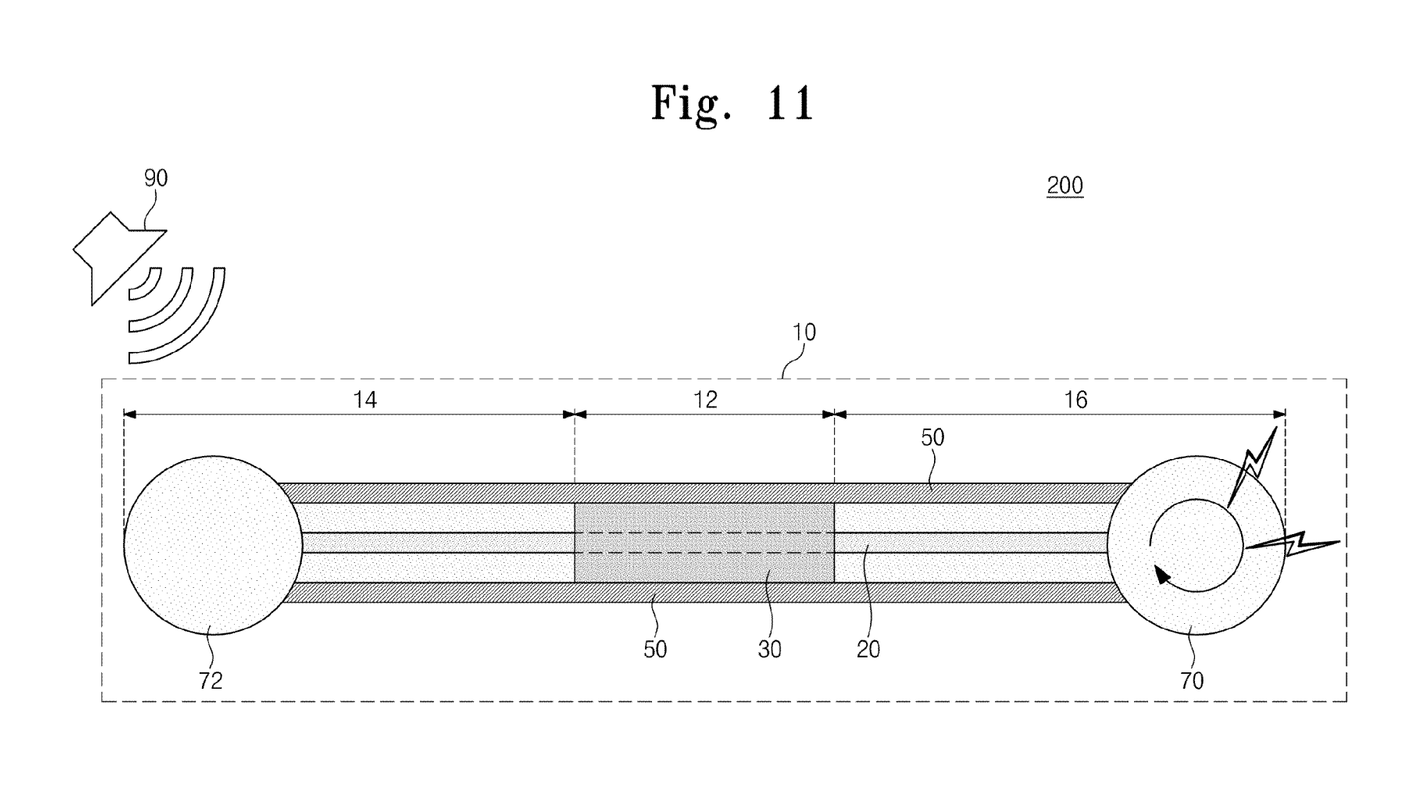
FIG. 11 is a plan view illustrating one application of the terahertz wave generating/detecting apparatus according to an embodiment of the inventive concept.

FIG. 11 is a plan view illustrating one application of a terahertz wave generating/detecting apparatus 200 according to an embodiment of the inventive concept.

Referring to FIGS. 2 and 11, a terahertz wave generating/detecting apparatus 200 may include a transmitting antenna 70 and a receiving antenna that are respectively disposed on the transmitting and reception regions defined in both sides of the active region 12. The receiving antenna 72 may receive a terahertz wave from a terahertz source 90. The lower metal layer 20 and the plurality of upper metal layers 50 may extend to the reception region 16. The receiving antenna 72 may be connected to the lower metal layer 20 and the upper metal layers 50. The terahertz wave may be transmitted from the receiving antenna 72 to the lower metal layer 20 and the plurality of upper metal layers 50. Although not shown, electric lines may be connected to the lower metal layer 20 and the upper metal layers 50. An external power voltage may be applied to the lower metal layer 20 and the upper metal layers 50 through the electric lines. The graphene layer 30 in the active region 12 may function as the N-type or P-type semiconductor. The lower metal layer 20 and the plurality of upper metal layers 50 may correspond to a gate, a source, and a drain of a transistor. The terahertz wave may be amplified or detected by performing a switching operation of the transistor. The amplified terahertz wave may be transmitted to the outside through the transmitting antenna 70 in the transmitting region 14.

Thus, the terahertz wave generating/detecting apparatus 200 according to the present invention may amplify or detect the terahertz wave.

The terahertz wave generating/detecting apparatus according to the embodiment of the inventive concept may include the lower metal layer, the graphene layer, and the upper metal layers. The graphene layer may be disposed between the graphene layer and the upper metal layers. The lower metal layer may become to the catalyst layer for forming the graphene layer. When the beated laser light is emitted onto the graphene layer and the lower metal layer, the surface plasmon polariton may be generated on the boundary surface between the graphene layer and the lower metal layer. The graphene layer may be activated by the surface plasmon polariton to generate the terahertz wave. The lower metal layer may be used as the medium for generating and transmitting the terahertz wave.

Thus, the terahertz wave generating/detecting apparatus according to the embodiment of the inventive concept may generate, amplify, and detect the terahertz wave by using the graphene layer as the active layer.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A terahertz wave generating/detecting apparatus comprising:

a substrate including an active region and a transmitting region;

a lower metal layer extending in a first direction and disposed on the active region and the transmitting region of the substrate;

a graphene layer disposed on a portion of the lower metal layer disposed on the active region of the substrate;

a plurality of upper metal layers extending in the first direction and disposed on the graphene layer and the transmitting region of the substrate; and a dielectric layer disposed on the graphene layer and between two adjacent upper metal layers, wherein a terahertz wave is generated or amplified by a surface plasmon polariton that is induced on a boundary surface between the graphene layer and the lower metal layer when beat laser light is applied to the graphene layer and the lower metal layer.

2. The terahertz wave generating/detecting apparatus of claim 1, wherein the upper metal layers are spaced apart from each other in a second direction crossing the first direction.

3. The terahertz wave generating/detecting apparatus of claim 1, wherein the dielectric layer comprises a polymer.

4. The terahertz wave generating/detecting apparatus of claim 3, wherein the polymer comprises benzocyclobutene (BCB).

5. The terahertz wave generating/detecting apparatus of claim 1, further comprising an interlayer dielectric between the lower metal layer and portions of the upper metal layers disposed over the transmitting region.

6. The terahertz wave generating/detecting apparatus of claim 5, wherein the interlayer dielectric is disposed on side surfaces of the portion of the lower metal layer disposed on the active region of the substrate and has a top surface that is coplanar with a top surface of the graphene layer.

7. The terahertz wave generating/detecting apparatus of claim 1, wherein the graphene layer has a width line greater than that of the lower metal layer.

8. The terahertz wave generating/detecting apparatus of claim 1, wherein the lower metal layer comprises nickel (Ni), copper (Cu), or platinum (Pt).

9. The terahertz wave generating/detecting apparatus of claim 1, further comprising a transmitting antenna coupled to portions of the lower metal layer and the upper metal layers disposed on the transmitting region of the substrate.

10. The terahertz wave generating/detecting apparatus of claim 9, wherein the substrate further includes a reception region, the reception region and the transmitting region being disposed on opposite sides of the active region in the first direction.

11. The terahertz wave generating/detecting apparatus of claim 10, wherein the lower metal layer and the upper metal layers extend to the reception region.

12. The terahertz wave generating/detecting apparatus of claim 11, further comprising a receiving antenna connected to portions of the lower metal layer and the upper metal layers disposed on the reception region of the substrate.

13. A method for manufacturing a terahertz wave generating/detecting apparatus, the method comprising:
  forming a lower metal layer on an active region and a transmitting region of a substrate;
  forming a graphene layer on a portion of the lower metal layer disposed over the active region;
  patterning the graphene layer and the lower metal layer to have a line-shape that extends in a first direction;
  forming an interlayer dielectric around the graphene layer disposed over the active region and on a portion of the lower metal layer disposed on the transmitting region;
  forming a plurality of upper metal layers extending in the first direction on the graphene layer and a portion of the interlayer dielectric disposed on the transmitting region; and
  forming a dielectric layer on the graphene layer and between two adjacent upper metal layers,
  wherein the plurality of upper layers are spaced apart from each other in a second direction crossing the first direction.

14. The method of claim 13, further comprising etching the lower metal layer to have a line width less than that of the graphene layer.

15. The method of claim 14, wherein the etching of the lower metal layer comprises a wet etching method.

16. The method of claim 15, wherein the wet etching method for the lower metal layer is performed by using hydrofluoric acid, nitric acid, or hydrochloric acid.

17. The method of claim 13, wherein the dielectric layer comprises a polymer, and wherein forming the dielectric layer comprises using an inkjet printing method or a screen process method.

* * * * *